United States Patent [19]

Nishikubo

[11] 4,296,490

[45] Oct. 20, 1981

[54] CRYSTAL OSCILLATION-TYPE ELECTRONIC TIMEPIECE

[75] Inventor: Yasuhiko Nishikubo, Iruma, Japan

[73] Assignee: Citizen Watch Co. Ltd., Tokyo, Japan

[21] Appl. No.: 14,641

[22] Filed: Feb. 23, 1979

Related U.S. Application Data

[63] Continuation-in-part of Ser. No. 757,025, Jan. 5, 1977, abandoned.

[30] Foreign Application Priority Data

Jan. 14, 1976 [JP] Japan .................................... 51-2073
Oct. 21, 1976 [JP] Japan .................................... 51-140664

[51] Int. Cl.[3] ........................ G04C 19/00; G04C 3/00; G04C 5/00; H03B 5/30

[52] U.S. Cl. ........................................ 368/87; 368/219; 331/116 FE

[58] Field of Search ................. 331/116 FE; 58/23 R, 58/23 A, 23 AC; 368/83, 87, 219

[56] References Cited

U.S. PATENT DOCUMENTS 3,956,880 5/1976 O'Connor ........................... 58/23 B
3,965,442 6/1976 Eaton .............................. 331/116 R

OTHER PUBLICATIONS

IEEE Journal of Solid State Circuits, vol. SC-7, No. 2, Apr. 1972, pp. 100–104, *Silicon-Gate CMOS Frequency Divider for the Electronic Wrist Watch.*

*Primary Examiner*—J. V. Truhe
*Assistant Examiner*—John B. Conklin
*Attorney, Agent, or Firm*—Sherman & Shalloway

[57] ABSTRACT

A crystal oscillation-type electronic timepiece having an oscillator with a crystal oscillator as a time base, means for dividing the frequency of the oscillator, display driving means and time display means. The oscillator has a complementary metal oxide semiconductor logic circuit including an inverter with a gated N-channel transistor and a gated P-channel transistor. The inverter is designed such that a ratio of the width and length in a channel of the gated N-channel transistor is made less than one and that a ratio of the width and length in a channel of the gated P-channel transistor is made less than two. The capacity of an input capacitor connected to an input of the crystal oscillating element is larger than that of an output capacitor connected to an input of the crystal oscillating element. The consumed power at the oscillating part is thereby decreased.

11 Claims, 5 Drawing Figures

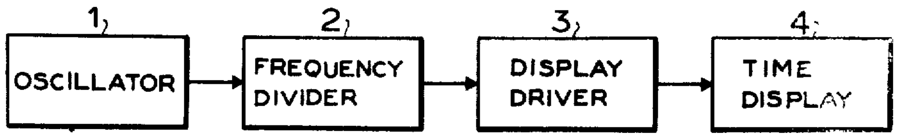
FIG. 1
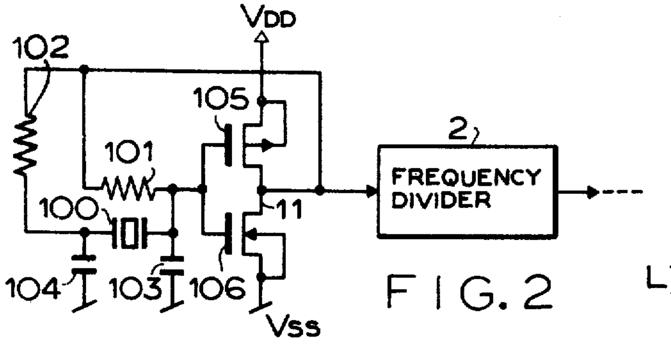
FIG. 2
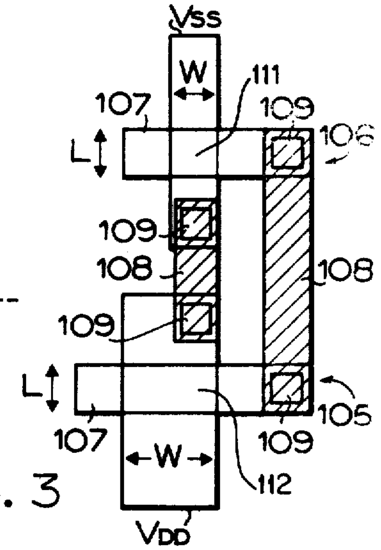
FIG. 3
FIG. 4
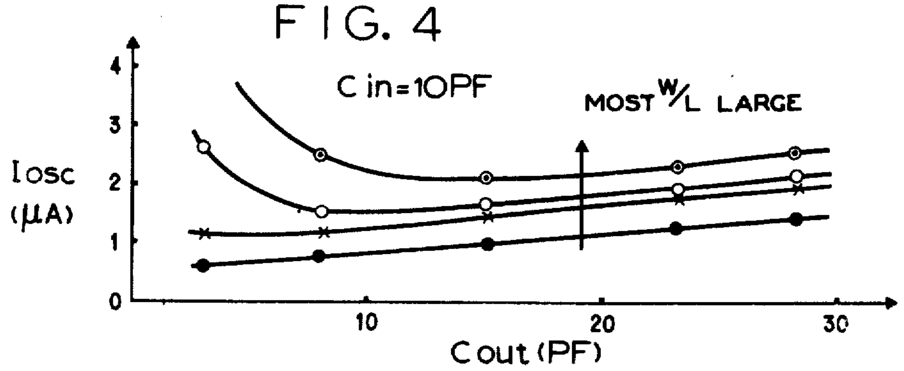
FIG. 5
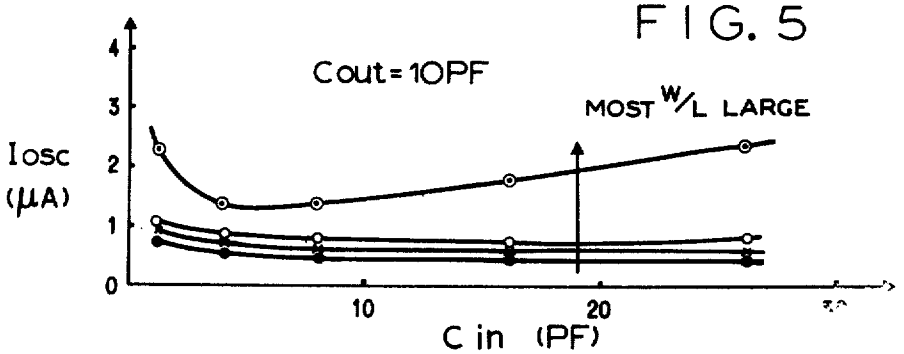

CRYSTAL OSCILLATION-TYPE ELECTRONIC TIMEPIECE

FIELD OF THE INVENTION

This application is a continuation-in-part application of Ser. No. 757,025 filed Jan. 5, 1977, now abandoned. This invention relates to a crystal oscillation-type electronic timepiece in which use is made of a complementary metal oxide semiconductor integrated circuit (hereinafter abbreviated as CMOS.IC) including means for dividing the frequency of a crystal oscillator element as a time base source into that of a time display arrangements. In particular, the timepiece of this invention comparatively reduces the ratio W/L of width of a channel and length thereof in a CMOST used in an oscillating part whereby the consumed power at the oscillating part is decreased.

DESCRIPTION OF THE PRIOR ART

Heretofore, a crystal oscillation-type electronic timepiece as shown in FIG. 1 wherein reference numeral 1 depicts an oscillator, 2 a frequency divider, 3 a display driver and 4 a time display has been used. The oscillator 1 is shown in FIG. 2 wherein reference numeral 11 denotes an inverter composed of CMOST, 100 a crystal oscillating element, 101 a feedback resistor, 104 an output capacitor, 103 an input capacitor and 102 a stabilization resistor. There has also been an oscillation part in which the stabilization resistor 102 is deleted and the output from the inverter 11 is directly connected with the output capacitor 104.

The ion plating technique has served to stabilize the threshold voltage and the improvement of the crystal oscillating element has reduced the value of the crystal impedance. The amplification degree of CMOS inverter 11 in the oscillator 1 has been designed at more than 100% to fill the minimum condition for oscillating stabilization. Therefore, a problem arises concerning the power consumption at the oscillator 1.

SUMMARY OF THE INVENTION

An object of the invention is to provide an electronic timepiece, of which the oscillator 1 comprises an inverter 11 of CMOST wherein a gate channel whose ratio of width and length, i.e., W/L is designed such that W/L of N-channel MOST is less than 1 and that W/L of P-channel MOST is less than 2 whereby the power consumption at the oscillating part 1 may be reduced.

Another object of the invention is to provide an electronic timepiece, of which the oscillating part is designed such that the capacity of the input capacitor Cin is larger than that of the output capacitor Cout whereby the power consumption at the oscillating part may be further reduced.

These and other objects of the present invention will become apparent to those skilled in the art upon consideration of the accompanying specification, claims and drawings.

DESCRIPTION OF THE DRAWINGS

Referring to the drawings wherein like numerals indicate like parts throughout the several views:

FIG. 1 is a block diagram showing the schematic view of an ordinary crystal oscillation-type electronic timepiece;

FIG. 2 is a circuit diagram showing one embodiment of an oscillating circuit;

FIG. 3 is a layout diagram of a pattern according to this invention concerning an oscillating inverter in FIG. 2;

FIG. 4 is a curve showing the characteristics Cout-Iosc of one embodiment according to this invention;

FIG. 5 is a curve showing the characteristics Cin-Iosc of one embodiment according to this invention.

DETAILED DESCRIPTION OF PREFERRED EMBODIMENTS

In FIG. 3 a layout of a pattern of a silicon gate of the CMOS inverter 11 as shown in FIG. 2 is illustrated. In the drawing, reference numeral 107 depicts a silicon gate, 108 a connecting aluminum electrode and 109 a contact hole. References $V_{DD}$ and $V_{SS}$ denote power supply sources. In this embodiment, use is made of a silicon CMOS.IC. The CMOS inverter 11 of the oscillator 1 is designed such that the ratio of width W and length L of the channel 111 in the N-channel MOST 106 is less than 1 and the ratio of W and L of the channel 112 in the P-channel 105 is less than 2. As the result, the power consumption can be reduced. A conventional CMOS invertor usually has a large ratio of W/L, e.g., W/L of the N-channel MOST being 6 and that of the P-channel MOST being 12. Under a frequency in the range of 32 KHz and, more specifically, 32768 H, and a power supply source of 1.55V, the current flowing through the oscillating part reaches 1.25 $\mu$A. In the CMOS inverter according to this invention, the current of the oscillator is 0.85 $\mu$A at W/L of the N-channel MOST being 1 and that of the P-channel being 2.

FIG. 4 is a curve showing the variation of current consumption Iosc in response to the capacity Cin of the input capacitor 103 when the amplification degree of the oscillating inverter 11, i.e., W/L of MOST is varied. FIG. 5 is a curve showing the variation of the current consumption Iosc in response to the capacity Cout of the output capacitor 104 when W/L MOST is varied. As obvious in FIGS. 4 and 5, the current becomes the smallest when the capacity Cout of the output capacitor is from 15 to 20 pF under the condition that the capacity Cin of the input capacitor is constant with reference to an inverter whose W/L is large. On the other hand, the current consumption Iosc becomes smaller when the capacity Cout of the output capacitor is smaller for an inverter having a small W/L ratio as disclosed in this invention. In view of the circuitry operation, it is obvious that this is also preferable because a charging current toward the output capacitor Cout decreases when the capacity Cout of the output capacitor is smaller. However, in the prior art, an oscillating inverter having a large W/L has been required due to CI (crystal impedance) characteristics, etc. of a crystal oscillating element.

It is further obvious that the current becomes the smallest under the condition that the capacity Cin of the input capacitor is from 5 to 7 pF with reference to the conventional inverter having a large ratio of W/L. While the current decreases when the capacity Cout of the output capacitor is large concerning an inverter with a small ratio of W/L.

Therefore, this invention is to provide CMOS invertor of an oscillating part being designed such that the ratio of the width W and length L of the gate channel in the N-channel MOST is less than 1 and the W/L ratio of the P-channel MOST is less than 2 whereby the current consumption of the oscillating part is reduced without the stabilization of the oscillator and the life of an electronic timepiece is prolonged. Further, by utilizing the elevation of C-I characteristics of a crystal oscillating element and high stabilization of manufacturing process, the ratio of W/L of an oscillating inverter is made small and appropriate as possible and then the ideal relation between Cin and Cout is reached. As the result, it proves that Cin>Cout is ideal in characteristics. This provides further effects that the power consumption at an oscillating part may be reduced and the life of the battery cell can be prolonged in addition to the effect as set forth above.

To further substantiate the unexpected results of this invention, the following tables of data collected by the inventors during experiments with the structure described herein are provided:

TABLE I

Dependence on CI Value (Cin = 15pF, Cout = 8pF)

| CI Value | 26kΩ | 45 | 65 | 85 | |
|---|---|---|---|---|---|
| IDD | 0.40μA | 0.43 | 0.47 | 0.49 | $(W/L)_N<1$ |
| Vend | 1.01V | 1.15 | 1.21 | 1.26 | $(W/L)_P<2$ |
| IDD | 0.32μA | 0.33 | 0.35 | 0.35 | $(W/L)_N<0.5$ |
| Vend | 1.31V | 1.38 | 1.44 | 1.55 | $(W/L)_P<1$ |

TABLE II

Dependence on Cin (Cout = 15pF, CI Value = 26kΩ)

| Cin | 1pF | 4 | 8 | 16 | 26 | | |
|---|---|---|---|---|---|---|---|
| IDD | 0.88μA | 0.72 | 0.58 | 0.51 | 0.47 | — $(W/L)_N<1$, | $(W/L)_p<2$ |
| IDD | 0.781 | 0.62 | 0.49 | 0.41 | 0.36 | — $(W/L)_N<0.5$, | $(W/L)_p<1$ |

TABLE III

Dependence on Cout (Cin = 8pF, CI Value = 26kΩ)

| Cout | 3Pf | 8 | 15 | 23 | 28 | | |
|---|---|---|---|---|---|---|---|
| IDD | 0.37μA | 0.45 | 0.58 | 0.75 | 0.83 | — $(W/L)_N<1$, | $(W/L)_p<2$ |
| IDD | 0.29 | 0.37 | 0.49 | 0.62 | 0.68 | — $(W/L)_N<0.5$, | $(W/L)_p<1$ |

As can be seen by referring to Table I, the CI value of the crystal oscillating element should be preferably less than 50Ω. Table II indicates that the capacitance of the output condenser is preferred to be less than 10 pF.

It has also been found that, in timepiece circuits employing the above invention, the resistance of the stabilizing resistor 102 should be between 100KΩ and 900KΩ for efficient operation. Similarly, the resistance of the feedback resistor 101 should be between 10MΩ and 100MΩ.

In the preferred embodiment, it is preferred that the output condenser be an MOS (metal oxide semi-conductor) and that the feedback resistor and stabilizing resistor be a diffusion resistor or an MOS resistor which is monolithic to effect proper timepiece operation.

What is claimed is:

1. A crystal oscillation-type electronic timepiece comprising an oscillator having a crystal oscillator with an input and an output as a time base, means for dividing the frequency of the oscillator, display driving means connected to said frequency dividing means, time display means connected to said display driving means, said oscillator having a complementary metal oxide simiconductor logic circuit having an inverter with a gated N-channel transistor and a gated P-channel transistor, said gated N-channel transistor having a channel with a width/length ratio of less than one, said gated P-channel transistor having a channel with a width-/length ratio of less than two, an input capacitor with a given capacitance connected to the input of the crystal oscillator and an output capacitor having a capacitance less than the given capacitance of said input capacitor connected to the output of the crystal oscillator.

2. The crystal oscillation-type electronic timepiece of claim 1 wherein the frequency of the crystal oscillating element is 32768 hertz.

3. The crystal oscillation-type electronic timepiece of claim 1 wherein the crystal impedance value of the crystal oscillator is less than 50KΩ.

4. The crystal oscillation-type electronic timepiece of claim 1 wherein the capacitance of the output capacitor is less than 10 pF.

5. The crystal oscillation-type electronic timepiece according to claim 1 wherein said stabilizing resistor has a resistance in the range of 100kΩ.

6. The crystal oscillation-type electronic timepiece according to claim 1 wherein a feedback resistor is connected to said crystal oscillator, said feedback resistor having a resistance in the range of 10MΩ to 100 MΩ.

7. The crystal oscillation-type electronic timepiece according to claim 1 wherein said output capacitor is comprised of a metal oxide semiconductor.

8. The crystal oscillation-type electronic timepiece according to claim 6 wherein said feedback resistor is a diffusion resistor which is monolithic.

9. The crystal oscillation-type electronic timepiece according to claim 6 wherein said feedback resistor is an MOS resistor which is monolithic.

10. An electronic timepiece according to claim 1 wherein said channels are made of silicon.

11. A crystal oscillation-type electronic timepiece comprising an oscillator having a crystal oscillator with an input and an output as a time base; means for dividing the frequency of the oscillator; display driving means connected to said means for dividing, time display means connected to said display driving means, said oscillator having a complementary metal oxide semiconductor logic circuit having an inverter with a gated N-channel transistor and a gated P-channel transistor, said gated N-channel transistor having a channel with a width/length ratio of less than one, said gated P-channel transistor having a channel with a width/ length ratio of less than two, an input capacitor with a given capacitance connected to the input of the crystal oscillator and an output capacitor having a capacitance less than the given capacitance of said input capacitor connected to the input of the crystal oscillator, and further including a stabilizing resistor connected to said crystal oscillator.

* * * * *